United States Patent [19]

Miyadera et al.

[11] 4,446,191

[45] May 1, 1984

[54] LAMINATES COMPRISING PREPREGS METAL CLAD

[75] Inventors: Yasuo Miyadera; Atsushi Fujioka, both of Shimodate; Tetsuo Kumazawa; Doi Hiroaki, both of Ibaraki, all of Japan

[73] Assignees: Hitachi Chemical Company, Ltd.; Hitachi, Ltd., both of Tokyo, Japan

[21] Appl. No.: 314,393

[22] Filed: Oct. 23, 1981

[30] Foreign Application Priority Data

Oct. 27, 1980 [JP] Japan ............................. 55-149459
Oct. 27, 1980 [JP] Japan ............................. 149460
Oct. 27, 1980 [JP] Japan ............................. 55-149463

[51] Int. Cl.$^3$ ............................................. B32B 5/08
[52] U.S. Cl. ............................. 428/245; 428/246; 428/251; 428/252; 428/257; 428/284; 428/285; 428/287; 428/298; 428/457
[58] Field of Search ............. 428/110, 111, 257, 258, 428/259, 273, 282, 287, 288, 289, 290, 901, 284, 285, 286; 57/244, 249

[56] References Cited

U.S. PATENT DOCUMENTS

| | | | |
|---|---|---|---|
| 3,778,334 | 12/1973 | Sturgeon et al. | 428/288 |
| 3,956,561 | 5/1976 | Anderson et al. | 428/901 |
| 3,972,765 | 8/1976 | Kondo et al. | 428/901 |
| 3,987,230 | 10/1976 | Gaker et al. | 428/901 |
| 4,254,186 | 3/1981 | Acitelli et al. | 428/901 |
| 4,304,811 | 12/1981 | David et al. | 428/225 |

FOREIGN PATENT DOCUMENTS 1486372 9/1977 United Kingdom.

*Primary Examiner*—James J. Bell
*Attorney, Agent, or Firm*—Antonelli, Terry & Wands

[57] ABSTRACT

A laminate produced by molding under heat and pressure a plurality of prepregs obtained by impregnating a resin into a composite fabric, either woven or nonwoven, comprising aromatic polyamide fibers and glass fibers has a low linear expansion coefficient and excellent interlaminar strength.

16 Claims, No Drawings

LAMINATES COMPRISING PREPREGS METAL CLAD

The present invention provides a heat resistant laminate with low expansion coefficient and excellent interlaminar strength.

There have been well known laminates which are prepared by impregnating substrates such as paper and glass cloth with a resin, followed by laminate molding thereof. However, it is difficult in such a laminate to increase a packaging density when mounting chips thereupon.

For instance, one of the high density packaging methods is to mount leadless chip carriers on a laminate. This method, however, involves a problem of degradation of joint portions between the chips and the substrate, said degradation being caused by the difference of thermal expansion coefficients between the two materials.

Meanwhile, it has been recently reported that laminates prepared by use of aromatic polyamide cloth having a negative linear expansion coefficient are advantageous for mounting chips (IEEE Transactions on Component, Hybrids and Manufacturing Technology vol. CHMT-2, No. 1, p 140, March, 1979).

This method can equalize thermal expansion coefficients of the substrate and the chips, so that there can advantageously be obtained high reliability on the joint portions. However, the most serious drawback of this substrate is that it is liable to cause delamination due to poor affinity between the resin and the aromatic polyamide and hence weak adhesion between the two when laminated. These laminates can therefore hardly withstand a heat cycle test and this prevents practical use thereof.

Another sort of laminates has been disclosed in Japan Pat. Appln. Kokai (Laid-Open) No. 3487/78 wherein the laminate is reinforced with woven fabric made from polyester fiber and glass fiber, but is inferior in heat resistance.

In view of the above, the present inventors have made intensive studies, and as a result, have found that, when composite fabric comprising 30-95% by weight of aromatic polyamide fiber and 5-70% by weight of glass fiber is used as a substrate of laminate, the resulting laminate is improved in interlaminar strength, and has low expansion coefficient and excellent heat resistance.

The laminate of this invention can be prepared by impregnating said composite fabric with a resin to give a prepreg, laminating a plurality of the resulting prepregs, and if necessary together with one or more copper or other metallic foils, followed by molding under heat and pressure. The contents by weight of aromatic polyamide fibers and glass fibers in the composite fabric are 30-95%, preferably 35-75% of the former, and 5-70%, preferably 25-65% of the latter. When the content of aromatic polyamide fiber is less than 30% (the content of glass fiber is more than 70%), the resultant laminate is unsatisfactory with respect to linear expansion coefficient, and when the content of aromatic polyamide fiber is more than 95% (the content of glass fiber is less than 5%), the resultant laminate exhibits an inferior interlaminar strength.

The composite fabric may be either woven fabric or nonwoven fabric. It may be a composite cloth prepared by twisting together one or more yarns of said aromatic polyamide fiber and one or more yarns of said glass fiber to form a combination yarn and weaving it; a nonwoven fabric prepared by cutting said combination yarn and arranging the cut yarns together randomly to form a mat having a uniform thickness; a composite union cloth obtained by weaving one or more yarns of said aromatic polyamide fiber and glass fiber alternately one by one, and the like.

The combination yarn prepared by twisting together said aromatic polyamide fiber and glass fiber includes; a combination doubling prepared by doubling one or a plurality of twisted yarns of aromatic polyamide fiber and one or a plurality of twisted yarns of glass fiber; a composite doubling prepared by doubling together a plurality of said combination doublings further twisted; and a combination yarn prepared by winding either of the aromatic polyamide fiber or glass fiber around the other fiber as a wadding thread at the direction of the wadding thread. The use of such microscopically uniform combination yarns as raw yarns for weaving composite fabric has an advantage of improving the workability to a large extent. For example, in weaving composite fiber cloth by the use of such a combination yarn, less nap is formed and the workability is therefore much better than in weaving glass cloth by the use of glass yarn.

Preferable number of twist of the combination yarn in the composite fabric ranges from 1 to 15 turns/25 mm, since the smaller the number of twist, the more it is difficult to obtain a microscopically uniform composite fabric, and the larger it becomes, the worse the impregnation of resin into the composite fabric becomes.

Preferable fineness of the combination yarn used in this invention is in the range of 10-150 tex (g/1000 m). Thicker combination yarn forms coaser composite fabric such as composite fiber cloth, resulting in a microscopically nonuniform FRP product, and finer composite yarn lowers the productivity of composite fiber cloth.

The aromatic polyamide fiber used in this invention is spun from an aromatic polyamide represent by the formula:

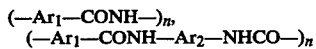

wherein $Ar_1$ and $Ar_2$ are the same or different and represent each aromatic residue and n is an integer of 50 or more. Examples of the aromatic residues are

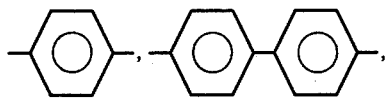

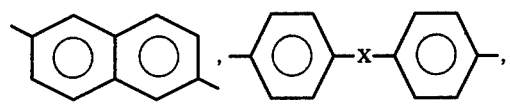

or the like (X is a divalent radical or an atom selected from O, $CH_2$, S, $SO_2$, and CO). These aromatic polyamides may be used alone or a mixture thereof. In addition, the aromatic polyamide may also contain

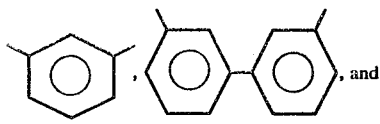, and

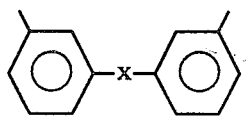

in amounts of up to 30% by mole for improving the solubility of the polymer. These aromatic residues may further be substituted by inactive radical such as halogen, alkyl, nitro. The especially preferred aromatic polyamide fibers are those spun from aromatic polyamides selected from poly(p-phenyleneterephthalamide), poly(p-benzamide), and copolymer of monomer units thereof. Kevlar 49 of E. I. du Pont de Nemours and Company can be used as the aromatic polyamide fiber. Processes for producing these aromatic polyamide fibers are disclosed, for example, in U.S. Pat. Nos. 3,671,542 and 3,888,965.

The glass fibers usable in the composite fabric include E-glass, C-glass, and A-glass fibers. For the purpose of minimizing the thickness of every layer of composite fiber cloth, it is preferable to use glass fibers having a diameter as small as possible, for example, ranging from 0.1 to 1.2 times that of the aromatic polyamide fiber.

The resins with which the composite fabric can be impregnated include organic materials such as thermosetting resins e.g., a phenol resin, an epoxy resin, an unsaturated polyester resin, a polyimide resin, a triazine resin, a melamine resin, a bisdiene polymer, etc.; linear polymers e.g., a polyethylene, a polysulphone, a polyamide-imide, a polyimide, etc.; inorganic materials, e.g., a silicone resin, a polyphosphazene, etc. These resins can be used alone or as a mixture thereof as well as copolymers of these resins. In particular, the epoxy resin and the polyimide resin are preferred.

The above-mentioned composite fabric is impregnated with such a resin, if necessary, together with a hardner to give a prepreg. Inorganic filler may also be incorporated by mixing with the resin. Preferable resin content in the prepreg is 30–70%, more preferably 35–65%, by volume. If it is less than 30% by volume, the impregnation becomes insufficient, and the content of more than 70% by volume is unfavorable for mounting chip carriers on the laminate because of affording larger linear expansion coefficients to the product.

The laminate of this invention can be obtained by laminating a plurality of said prepregs and molding under heat and pressure. The resulting laminate has improved heat resistance and interlaminar strength and exhibits low coefficient of thermal expansion and excellent dimensional stability in the direction of the laminate. The laminate can be overlaid with metal foils such as copper foil, aluminum foil, etc.

This invention will be illustrated in more detail by way of the following examples, in which all parts and percents are by weight unless otherwise specified.

EXAMPLE 1

A varnish having a resin content of 37% was prepared by adding methyl ethyl ketone and methyl Cellosolve as solvent to 90 parts of a brominated bisphenol A type epoxy resin (Araldite 8011, manufd. by Ciba-Geigy Corp., epoxy equivalent weight 480 g/eq.), 10 parts of a cresol novolak type epoxy resin (ECN-1280, manufd. by Ciba-Geigy Corp., epoxy equivalent weight 220 g/eq.), 4 parts of dicyandiamide, and 0.2 part of benzyldimethylamine.

On the other hand, combination yarn of 0.15 mm in fineness was prepared by twisting one glass fiber of 22.5 tex together with one Kevlar 49 fiber of 21.7 tex (manufd. by E. I. du Pont de Nemours & Co., the above-mentioned aromatic polyamide fiber), and composite cloth having a density of fabric of 37×37 per 25 mm wide was prepared by weaving said combination yarn.

Prepregs were obtained by dipping this composite cloth in the above-said varnish and then drying it at 160° C. for 5 minutes. The resin content of each prepreg was 29.5% (about 35% by volume).

Then, 8 plys of these prepregs were interposed between two copper foils (each 35μ thick), and a copper-clad laminate of 1.03 mm in thickness was obtained by pressing these plys at 170° C. for 60 minutes.

The linear expansion coefficient of this laminate in the plane direction was $5.8 \times 10^{-6}$°C.$^{-1}$. The measurement was made by using a thermo-mechanical analyser TM 1500L/RH (made by Shinkū Rikō K.K.) at a heating rate of 5° C./min under a load of 2 g. The peel-off strength of copper foil was 1.9 kg/cm and the interlaminar strength 2.5 kg/cm or more. Said peel-off strength and interlaminar strength were measured in accordance with the peeling test method of JIS C6481. Measurements in the following examples were also made in the same way.

EXAMPLE 2

Composite cloth having a density of fabric of 37×37 per 25 mm wide was prepared by twisting two Kevlar 49 yarns of each 21.7 tex, mentioned above, together with one glass yarn of 22.5 tex and weaving the resulting combination yarn of 0.2 mm in fineness. The composite cloth was treated with γ-glycidoxypropyltrimethoxysilane.

Prepregs of resin content 29% (about 33% by volume) were made by impregnating said cloth at a treating speed of 1.6 m/min at 162° C. with the same varnish as used in Example 1, except for changing the resin content to 35%. Then, 6 plys of these prepregs were interposed between two copper foils, each 35μ thick, and pressed at 80 kg/cm$^2$ at 170° C. for 1 hour to prepare a copper-clad laminate 1.06 mm thick. The linear expansion coefficient of this laminate in the plane direction was $5 \times 10^{-6}$°C.$^{-1}$ and the interlaminar strength 1.5 kg/cm or more.

EXAMPLE 3

Prepregs were prepared by impregnating the same composite cloth as used in Example 1 with a solution of a polyaminobismaleimide in N-methyl-2-pyrrolidone. The resin content of these prepregs was 43%. Then, 8 plys of these prepregs were interposed between two copper foils each 35μ thick and pressed at 80 kg/cm$^2$ and 190° C. for 2 hours to prepare a laminate, which was then post-cured at 240° C. for 8 hours. The linear expansion coefficient of this laminate in the plane direction was $6.5 \times 10^{-6}$°C.$^{-1}$ and the interlaminar strength 1.0 kg/cm or more.

COMPARATIVE EXAMPLE 1

Prepregs were made by impregnating glass cloth 0.2 mm thick with the same varnish as use in Example 1, and 8 plys of these prepregs were interposed between two copper foils each 35μ thick and pressed at 80 kg/cm² and 170° C. for 1 hour to prepare a copper-clad laminate. The interlaminar strength of this laminate was 2.5 kg/cm or more, but the linear expansion coefficient in the plane direction was as large as $2.9 \times 10^{-5} °C.^{-1}$.

COMPARATIVE EXAMPLE 2

A varnish having a resin content of 37.5% was prepared by adding methyl ethyl ketone and methyl Cellosove to 40 parts of a phenol novolak type epoxy resin (Epikote 154, Shell Chemical Co., epoxy equivalent weight 180 g/eq), 60 parts of a brominated bisphenol A type epoxy resin (BREN, Nippon Kayaku Co., Ltd., epoxy equivalent weight 285 g/eq), 6.4 parts of dicyandiamide, and 0.1 part of benzylamine.

Cloth 0.11 mm thick made from Kevlar 49 fiber was impregnated with said varnish at a treating speed of 1.5 m/min and a temperature of 162° C.

Then, 10 plys of the prepregs thus obtained were interposed between two copper foils each 35μ thick and pressed at 80 kg/cm² and 170° C. for 1 hour to prepare a copper-clad laminate 0.8 mm thick. The linear expansion coefficient of this laminate in the plane direction was $5.5 \times 10^{-6} °C.^{-1}$, but the interlaminar strength was only 0.7 kg/cm.

As can be seen from the foregoing Examples and Comparative Examples, the laminate of Comparative Example 1 has too large linear expansion coefficient and that of Comparative Example 2 has poor interlaminar strength, both being fatal defects in practical use. In contrast, the laminates of Examples of this invention, having linear expansion coefficients in the vicinity of $6 \times 10^{-6} °C.^{-1}$, comparable to those of ceramics, as well as high interlaminar strength, are worthy for practical use.

EXAMPLE 4

A varnish having a resin content of 60% was prepared by adding methyl ethyl ketone and methyl Cellosolve as solvent to 90 parts of a brominated bisphenol A type epoxy resin (the same as used in Example 1), 10 parts of a cresol novolak type epoxy resin (the same as used in Example 1), 4 parts of dicyandiamide, and 0.2 part of benzyldimethylamine.

On the other hand, a combination yarn was prepared by twisting one glass yarn of 22.5 tex together with one Kevlar 49 yarn of 21.7 tex. Said combination yarn was continuously cut into short segments, which were randomly superposed together to form a mat of uniform thickness, i.e., a nonwoven fabric of 290 g/m² in basis weight.

This nonwoven fabric was dipped in said varnish and then dried at 160° C. for 5 minutes. The resin content in the prepreg thus prepared was 44% (about 51% by volume).

Then, 5 plys of this prepreg were interposed between two copper foils (each 35μ thick), and pressed at 170° C. for 60 minutes to prepare a copper-clad laminate 1.6 mm thick. The linear expansion coefficient of this laminate in the plane direction was $8.5 \times 10^{-6} °C.^{-1}$. The peel-off strength of copper foil was 1.8 kg/cm and the interlaminar strength 2 kg/cm or more.

COMPARATIVE EXAMPLE 3

Prepregs of resin content 41% (about 56% by volume) were prepared by impregnating nonwoven glass cloth of 300 g/m² in basis weight with the same varnish as used in Example 4.

Then, 6 plys of these prepregs were interposed between two copper foils (each 35μ thick) and pressed at 170° C. for 60 minutes to prepare a copper-clad laminate 1.6 mm thick. The interlaminar strength of this laminate was 2.0 kg/cm or more, but the linear expansion coefficient in the plane direction was as large as $3.5 \times 10^{-5} °C.^{-1}$.

Example 4 and Comparative Example 3 show that the laminate of this invention exhibits a low linear expansion coefficient as well as high interlaminar strength compared with the case of employing nonwoven fabric made of glass as the substrate.

EXAMPLE 5

Glass yarns ECG 75-1/23.8S specified in JIS and Kevlar 49 yarns were wound on respective warp beams. Using a Jet loom capable of beating two kinds of weft yarns, there was prepared composite union cloth wherein every two yarns of glass and Kevlar 49, both as warp and weft, align alternately.

The composite union cloth was dipped in the same varnish as used in Example 1, and then dried at 160° C. for 5 minutes to give prepregs. The resin content of the prepregs thus formed was 29.5% (about 35% by volume).

Then, 8 plys of these prepregs were interposed between two copper foils and pressed at 170° C. for 60 minutes to prepare a copper-clad laminate 1.03 mm thick.

The linear expansion coefficient of this laminate in the plane direction was $5.8 \times 10^{-6} °C.^{-1}$. The peel-off strength of the copper foil was 1.7 kg/cm and the interlaminar strength 2 kg/cm or more.

What is claimed is:

1. A metal-clad laminate produced by impregnating composite fabric comprising 30–95% by weight of aromatic polyamide fiber and 5–70% by weight of glass fiber arranged together, with a resin to form a prepreg, laminating a plurality of said prepregs together with at least one metallic foil, and molding the laminated metal-clad prepregs under heat and pressure.

2. A laminate according to claim 1, wherein said composite fabric is composite cloth obtained by weaving combination yarns obtained by twisting one or more yarns of aromatic polyamide fiber together with one or more yarns of glass fiber.

3. A laminate according to claim 1, wherein said composite fabric is a nonwoven fabric prepared by cutting the combination yarn obtained from twisting one or more yarns of aromatic polyamide fiber together with one or more yarns of glass fiber and randomly arranging the cut yarns together so as to provide a mat of a uniform thickness.

4. A laminate according to claim 1, wherein said composite fabric is a composite union cloth obtained by weaving one or more yarns of aromatic polyamide fiber and glass fiber alternately one by one.

5. A laminate according to claim 1, 2, 3, or 4, wherein said aromatic polyamide fiber is spun from a polymer selected from poly(p-phenyleneterephthalamide), poly(p-benzamide), and copolymers of p-phenyleneterephthalamide or p-benzamide.

6. A laminate according to claim 5, wherein the ratio of diameter of the aromatic polyamide fiber to the glass fiber is 1:0.1–1.2.

7. A laminate according to claim 2, wherein the number of twist of said combination yarn is 1–15 turns/25 mm.

8. A laminate according to claim 7, wherein the fineness of said combination yarn is 10–150 tex.

9. A laminate according to claim 1, wherein said resin is selected from an epoxy resin and a polyimide resin.

10. A laminate according to claim 1, wherein the resin content in the prepreg is 30–70% by volume.

11. A laminate according to claim 1, wherein said laminate is overlaid with one or more copper foils.

12. A copper-clad laminate comprising a plurality of composite fabric-reinforced resin prepregs laminated together with and interposed between copper foils, said composite fabric being a woven cloth formed of combination yarns containing 30–95% by weight of aromatic polyamide yarn twisted together with 5–70% by weight of glass yarn.

13. A laminate according to claim 12, wherein said resin is selected from the group consisting of an epoxy resin and a polyimide resin.

14. A laminate according to claim 12, wherein the resin content of each prepreg is 30–70% by volume and the number of twists of said combination yarn is 1–15 turn/25 mm.

15. A copper-clad laminate produced by impregnating a composite fabric comprising 30–95% by weight of aromatic polyamide fiber and 5–70% by weight of glass fiber with a resin to form a prepreg, laminating a plurality of the resulting prepregs together, and molding the laminated prepregs under heat and pressure; said composite fabric being a composite cloth obtained by weaving a combination yarn obtained by twisting one or more yarns of aromatic polyamide fiber together with one or more yarns of glass fiber and the resulting laminate being overlaid and bonded with one or more copper foils and being suitable for mounting chips thereon.

16. A laminate according to claim 15, wherein the resin is selected from the group consisting of an epoxy resin and a polyamide resin, the resin content of each prepreg is 30–70% by volume; and the number of twists of said combination yarn is 1–15 turns/25 mm.

* * * * *